US012701819B2

(12) United States Patent
Hoffmann et al.

(10) Patent No.: US 12,701,819 B2
(45) Date of Patent: Aug. 4, 2026

(54) BACK-SIDE CONTACT SOLAR CELL

(71) Applicant: Silfab Solar Cells SC Inc., Fort Mills, SC (US)

(72) Inventors: Erik Hoffmann, Stuttgart (DE); Jürgen Werner, Stuttgart (DE)

(73) Assignee: Silfab Solar Cells SC Inc., Fort Mill, SC (US)

( * ) Notice: Subject to any disclaimer, the term of this patent is extended or adjusted under 35 U.S.C. 154(b) by 0 days.

(21) Appl. No.: 17/923,405

(22) PCT Filed: Mar. 22, 2021

(86) PCT No.: PCT/EP2021/057244
§ 371 (c)(1),
(2) Date: Apr. 4, 2023

(87) PCT Pub. No.: WO2021/223932
PCT Pub. Date: Nov. 11, 2021

(65) Prior Publication Data
US 2023/0223483 A1 Jul. 13, 2023

(30) Foreign Application Priority Data

May 4, 2020 (DE) ..................... 10 2020 111 997.6

(51) Int. Cl.
*H10F 77/1223* (2025.01)
*H10F 71/00* (2025.01)
*H10F 77/48* (2025.01)
(52) U.S. Cl.
CPC ..... *H10F 77/1223* (2025.01); *H10F 71/1221* (2025.01); *H10F 77/48* (2025.01)

(58) Field of Classification Search
CPC ......... H01L 31/02167; H01L 31/02168; H01L 31/0682; H10F 77/1223; H10F 77/219;
(Continued)

(56) References Cited

U.S. PATENT DOCUMENTS 7,468,485 B1 12/2008 Swanson
9,059,341 B1* 6/2015 Scardera ............. H01L 31/1804
(Continued)

FOREIGN PATENT DOCUMENTS

CN 105185858 A 12/2015
CN 108682701 A 10/2018
(Continued)

OTHER PUBLICATIONS

Examination Report, pp. 1-6.
(Continued)

*Primary Examiner* — Mayla Gonzalez Ramos
(74) *Attorney, Agent, or Firm* — Central California IP Group, P.C.; Andrew D. Fortney

(57) ABSTRACT

The invention relates to a back-side contact solar cell including a semiconductor substrate, in particular a silicon wafer, including a front side and a back side, the solar cell having electrodes of a first polarity and electrodes of a second polarity on the back side, wherein a tunnel layer and a highly doped silicon layer are positioned under the electrodes of a first polarity, and the electrodes of the second polarity make direct electrical and mechanical contact with the semiconductor substrate.

18 Claims, 5 Drawing Sheets

(58) Field of Classification Search
CPC ...... H10F 77/48; H10F 10/146; H10F 19/908; H10F 71/1221; H10F 77/1221
See application file for complete search history.

(56) References Cited

U.S. PATENT DOCUMENTS

| | | | |
|---|---|---|---|
| 9,130,074 B2 | 9/2015 | Schultz-Wittmann et al. | |
| 9,577,050 B2 | 2/2017 | Tomizawa et al. | |
| 10,243,090 B2 | 3/2019 | Yang et al. | |
| 2013/0228902 A1 | 9/2013 | Tomizawa et al. | |
| 2014/0090701 A1* | 4/2014 | Rim .................... | H01L 31/1804 136/258 |
| 2014/0096821 A1* | 4/2014 | Chen .................. | H01L 31/0352 438/96 |
| 2014/0179054 A1 | 6/2014 | Recaman Payo et al. | |
| 2014/0338747 A1* | 11/2014 | Choi .................... | H10F 10/146 136/258 |
| 2015/0357507 A1* | 12/2015 | Yang .............. | H01L 31/022441 438/98 |
| 2017/0117433 A1 | 4/2017 | Stangl et al. | |
| 2019/0027630 A1 | 1/2019 | Masuko et al. | |
| 2019/0097078 A1* | 3/2019 | Geerligs ............. | H01L 31/0682 |
| 2019/0207052 A1 | 7/2019 | Masuko et al. | |
| 2020/0279968 A1 | 9/2020 | Bende et al. | |
| 2023/0335663 A1 | 10/2023 | Hoffmann | |

FOREIGN PATENT DOCUMENTS

| | | | | |
|---|---|---|---|---|
| CN | 209087883 U | 7/2019 | | |
| CN | 110634964 A | 12/2019 | | |
| DE | 10 2013 219 564 A1 | 4/2015 | | |
| DE | 102013220753 A1 * | 4/2015 | .......... | H01L 21/268 |
| EP | 2804219 A1 | 5/2014 | | |
| EP | 2955760 A1 | 12/2015 | | |
| JP | 2013-120895 A | 6/2013 | | |
| JP | 2019-121627 A | 7/2019 | | |
| KR | 10-2018-0067782 A | 6/2018 | | |
| TW | 201635574 A | 10/2016 | | |
| TW | 201929241 A | 7/2019 | | |
| WO | 2014100004 A1 | 6/2014 | | |
| WO | 2017168977 A1 | 10/2017 | | |
| WO | 2019059765 A1 | 3/2019 | | |

OTHER PUBLICATIONS

International Preliminary Report on Patentability, pp. 1-4.
International Search Report and Written Opinion, PCT/EP2021/057244, filed Mar. 22, 2021. Mailing date of search report, May 27, 2021. pp. 1-7.

\* cited by examiner

BACK-SIDE CONTACT SOLAR CELL

CROSS REFERENCE TO RELATED APPLICATION

This application is the United States National Phase application filed under 35 U.S.C. 371 of International Application No. PCT/EP2021/057244, filed Mar. 22, 2021, which claims priority to German Patent Application No. 10 2020 111 997.6 filed with the German Patent Office on May 4, 2020, the entirety of each of which is hereby incorporated by reference.

BACKGROUND

The invention relates to a solar cell and to a method for producing a solar cell.

As is known, solar cells serve as photovoltaic elements for converting light into electrical energy. Charge carrier pairs, which are generated when light is absorbed in a semiconductor substrate, are separated at the junction between an emitter region, which has a first doping type, e.g., n-type or p-type (to produce a first polarity), and a base region, which has an opposite doping type (to produce opposite polarity). The charge carrier pairs generated and separated in this way can be fed to an external circuit via emitter contacts which contact the emitter region, and via base contacts which contact the base region.

Solar cells are known in which contacts of one polarity are arranged on the front side and contacts of the opposite polarity are arranged on the back side. The side facing the sun is called the front side; the back side is on the side facing away. In order to minimize losses resulting from shading by the contacts on the front side, back-side contact solar cells have been developed in which both contact types, i.e., the emitter contacts and the base contacts, are arranged on a back side of the semiconductor substrate.

Back-side contact solar cells have great potential for higher efficiencies, since there is no shading on the front side of the solar cells and the incoming radiation thus generates more free charge carriers. The electrodes of the two polarities are arranged next to each other on the back side of the solar cell. The generated charge carriers must therefore also flow laterally in the solar cell. In order to minimize the resistance losses caused by this lateral current flow and to prevent the free charge carriers from recombination before they reach the electrodes, the electrodes of the two polarities should be as close as possible to each other. Since the electrodes are connected to p-type or n-type silicon, depending on polarity, the p-n junctions are also as close together as possible. The p-n junctions—fine, comb-like structures with a resolution of less than 500 μm—can be created, for example, by means of laser irradiation. In this process, a pulsed laser beam drives two different dopants, e.g., boron and phosphorus, locally into the silicon by melting the surface separately in terms of time and location, and produces either a high p-type or n-type doping depending on the dopant. Such fine structures allow low internal series resistances and efficiencies η to n=24%. Higher efficiencies are substantially limited by recombination mechanisms in the base, as well as on the highly doped contacted and uncontacted surfaces. The recombination in the base depends on the wafer quality, and can only be influenced to a small extent in the further manufacturing process of the solar cell. The recombination at the highly doped n-type and p-type surfaces is limited in the uncontacted region with a good surface passivation, such as in the case of amorphous hydrogenated silicon, by Auger recombination, which increases with the dopant concentration in the silicon. In the contacted region, the silicon is in contact with a metal, resulting in high interfacial recombination. In the solar cell process, Auger recombination on the uncontacted surfaces can be reduced if there is as little dopant as possible in the silicon, while interface recombination on the metal/silicon contacts can be reduced by using the smallest possible contact area. However, simply reducing the dopant and contact areas increases the series resistance, which then becomes the limiting factor for efficiency.

For this reason, passivated or selective contacts are used. The metal electrodes are not electrically connected directly to the crystalline base, but are separated by a thin tunnel oxide, which passivates the silicon surface, but which is so thin at the same time that the electrons can tunnel through the oxide from the semiconductor into the electrode, and/or from the electrode into the semiconductor, according to the polarity. In order to excite the electrons to tunnel, there must be an electric field at the tunnel oxide. The electric field can be generated by a highly doped n-type or p-type silicon on the tunnel oxide. Since the doping of this silicon above the tunnel oxide leads to a band bending in the silicon base below the tunnel oxide, a higher doping of the silicon base is no longer necessary. On the highly doped n-type silicon, only electrons pass through the tunnel oxide, also known as electron flow, while on the highly doped p-type silicon only a so-called hole flow takes place: Electrons enter the silicon base from the highly doped p-type silicon. The metal electrodes themselves are only in electrical and mechanical contact with the highly doped n-type or p-type silicon above the tunnel oxide. Depending on the doping, the selectivity of the highly doped silicon regions in combination with the tunnel oxide ensures that almost exclusively one type of charge carrier is transported to the metal/silicon contact areas, and minimizes interfacial recombination. The presented structure further decreases the Auger recombination at the surface of the silicon base to the tunnel oxide, since no high doping is required for the p-n junction or the ohmic contact to the base at this interface. Back-side contact solar cells with passivated contacts have so far achieved a record efficiency of η=26.7%. However, the production of such cells has hitherto been very complex, since the two differently doped selective contacts can only be applied with various complex masking and structuring steps. In doing so, attention must be paid to high precision and fine resolution of the masking/structuring. The distance between the selective contacts must not be too large and should not exceed the diffusion length of the free charge carriers, nor lead to an increase in the internal series resistance due to the lateral current flow in the base. Production methods with masking steps are known from EP 2 955 760 A1, US 2014/096821 A1 and EP 2 804 219 A1.

SUMMARY OF THE INVENTION

These disadvantages are overcome by a method according to the invention for producing a solar cell, and by a solar cell according to the invention, produced according to this method.

According to the invention, for a back-side contact solar cell comprising a semiconductor substrate, in particular a silicon wafer, which has a front side facing the sun and a back side, wherein the solar cell comprises, on the back side, electrodes of a first polarity and electrodes of a second polarity, and wherein a tunnel layer and a highly doped silicon layer are positioned under the electrodes of the first polarity, it is proposed that the electrodes of the second polarity make direct electrical and mechanical contact with the semiconductor substrate in highly doped base regions, wherein the highly doped base regions comprise selectively overcompensated regions of the highly doped silicon layer.

The high doping of the highly doped base regions is necessary for low contact resistance.

According to one embodiment, it is provided that an uncontacted, lightly doped region separates the highly doped silicon layer from the base region. In this uncontacted, passivated region, a lower doping than in the contacted, highly doped base region can be advantageous.

Further embodiments relate to a method for producing a back-side contact solar cell according to the embodiments described above. The production of a fine-resolution structuring on the back side is done without any masking. It is realized by local laser irradiation. The method is described below.

The semiconductor substrate, in particular the silicon wafer, of the solar cell comprises a, in particular polished or textured, back side, and a, in particular textured, front side. In a first step of the method, a tunnel layer, in particular comprising silicon oxide, is applied to a surface of the front side and/or to a surface of the back side. The tunnel layer has a thickness of preferably at most about four nanometers. The tunnel layer is produced, for example, in a thermal or wet-chemical process, or by deposition.

The method further comprises a step of depositing a highly doped, in particular full-area, silicon layer of a first polarity on the tunnel layer to the back side. The highly doped silicon layer of the first polarity can be deposited, for example, by means of plasma-enhanced chemical vapor deposition, PECVD, atmospheric chemical vapor deposition, APCVD, low-pressure chemical vapor deposition (LPCVD), or sputtering. The highly doped silicon layer of the first polarity has a thickness of approximately 100 nanometers to 300 nanometers.

The highly doped silicon layer of the first polarity can be deposited in two steps instead of one. According to one embodiment, depositing the highly doped silicon layer of the first polarity comprises depositing undoped silicon and then introducing a dopant. The dopant is introduced, for example, by means of ion implantation, furnace diffusion, or laser diffusion. The dopant is, for example, boron, aluminum, or gallium.

According to one embodiment, it is provided that the method comprises a step of removing the tunnel layer, in particular silicon dioxide and/or the highly doped silicon layer of the first polarity, from the front side. The tunnel layer and/or the highly doped silicon layer of the first polarity can be etched away over the entire area, or locally.

The method comprises a step of applying a precursor layer comprising a dopant of a second polarity onto the highly doped silicon layer of the first polarity on the back side and/or on the front side. If the highly doped first polarity silicon layer is a p-type silicon layer, the dopant for doping the silicon according to the second polarity is, for example, phosphorus. To apply the precursor layer, a furnace diffusion process can be carried out, for example, in which phosphorus silicate glass grows on the highly doped p-type silicon layer on the back side and on the front side. The furnace diffusion process can be carried out in such a way that a high proportion of phosphorus is contained in the phosphorus silicate glass after the furnace diffusion process. During furnace diffusion, phosphorus diffuses into the front side of the solar cell and dopes the front side surface to n-type. On the back side, the phosphorous also diffuses into the highly doped p-type silicon layer. The parameters of the furnace diffusion are selected in such a way that the dopant concentration of the phosphorus does not exceed the dopant concentration of boron in the p-type silicon layer. The precursor layer, e.g., phosphorus silicate glass, can also be applied using other methods, such as PECVD.

According to one embodiment, it is provided that a part of the second dopant diffuses from the precursor layer into the highly doped silicon layer during the furnace diffusion. The furnace diffusion is carried out in such a way that the dopant concentration of the second diffused dopant does not exceed the dopant concentration of the first dopant in the highly doped silicon layer. This prevents overcompensation of the first dopant during furnace diffusion. Thus, if the highly doped first polarity silicon layer is a p-type silicon layer and the second polarity dopant is phosphorous, the highly doped p-type silicon layer will remain p-type doped. In contrast, the amount of the second dopant that is still in the precursor layer is greater than the amount of dopant of the first dopant in the highly doped silicon layer.

The method comprises a step of laser irradiation of the back side, in particular for producing locally highly doped base regions of a second polarity. If the previously applied dopant of the second polarity is phosphorus, the phosphorus silicate glass serves as a doping source during the laser irradiation for the production of locally highly doped n-type base regions. The energy of the laser radiation locally melts the phosphorus silicate glass, the highly doped p-type silicon layer, the tunnel layer, and the surface of the back side in selected regions. The dopants from the phosphorus silicate glass and the highly doped p-type silicon layer diffuse into the silicon melt on the surface of the back side. After the laser radiation has subsided, the melt cools and solidifies. Both dopants remain in the silicon, with one or both dopants accumulating at the surface. Due to the larger amount of dopant of the second polarity in the precursor layer, the concentration of the second dopant in the solidified silicon surface is significantly higher than the concentration of the first dopant from the highly doped p-type silicon layer, and thus leads to locally high n-type doping through overcompensation in the selected regions. By suitably selecting the laser parameters, portions of n-type silicon with different levels of doping can also be produced locally and selectively in the selected regions.

According to one embodiment, it is provided that the method comprises a step of selectively removing the highly doped silicon layer of the first polarity and/or the precursor layer. By removing the layer or layer stack in adjacent regions of different polarity, the contact between the two differently doped regions is interrupted, and it is possible to prevent high recombination or short circuits from occurring in the contact regions. The selective removal of the highly doped silicon layer of the first polarity can take place, for example, by laser irradiation, wet-chemical etching, or a combination of both processes. The precursor layer, in particular phosphorus silicate glass, can be removed, for example, by wet-chemical etching. If the highly doped first polarity silicon layer is a p-type silicon layer and the second polarity dopant is phosphorus, etching back a few nanometers of the p-type silicon layer can remove some of the silicon layer with high phosphorus content, and an increase in the layer resistance of the p-type silicon layer can be limited by phosphorus diffusion.

According to one embodiment, it is provided that the method comprises a step of applying a passivation layer to the surface of the front side and/or back side. The passivation layer comprises, for example, thermally grown silicon dioxide, silicon nitride, aluminum oxide, or a layer stack made up of two or more dielectric layers. The thickness, refractive index, and composition of the passivation layer on the back side can differ from the thickness, refractive index, and composition of the passivation layer on the front side. The thicknesses of the passivation layers are advantageously optimized to reduce reflection on the front side and increase reflection on the back side.

According to one embodiment, it is provided that the method comprises a step of applying electrodes to the back side of the solar cell. The electrodes can be applied, for example, by means of screen printing, vapor deposition, sputtering, or galvanic deposition of one or more metals or other conductive layers. The electrodes can comprise, for example, silver paste, silver/aluminum paste, aluminum paste, or pure aluminum, copper, tin, palladium, silver, titanium, nickel, or layer stacks or alloys of the metals mentioned, or other conductive layers, in particular conductive polymers or oxides, or a combination of such layers with metals. The composition and deposition process of the electrodes may differ for both polarities. The electrodes can penetrate the passivation layer locally, particularly in a high-temperature step after the screen printing, and, depending on the polarity of the electrodes, can contact either the highly doped p-type silicon layer or the highly doped base regions.

According to one embodiment, it is provided that the method comprises a step of selectively removing the passivation layer. Before the electrodes are deposited, the passivation layer can be removed locally, for example by laser irradiation.

Further features, possible uses and advantages of the invention can be found in the following description of embodiments of the invention, which are shown in the drawings. All of the features described or illustrated form the subject matter of the invention individually or in any combination, regardless of their summarization in the patent claims or the claims to which they refer, and regardless of their formulation or representation in the description or in the drawings.

DETAILED DESCRIPTION

Figure 1:
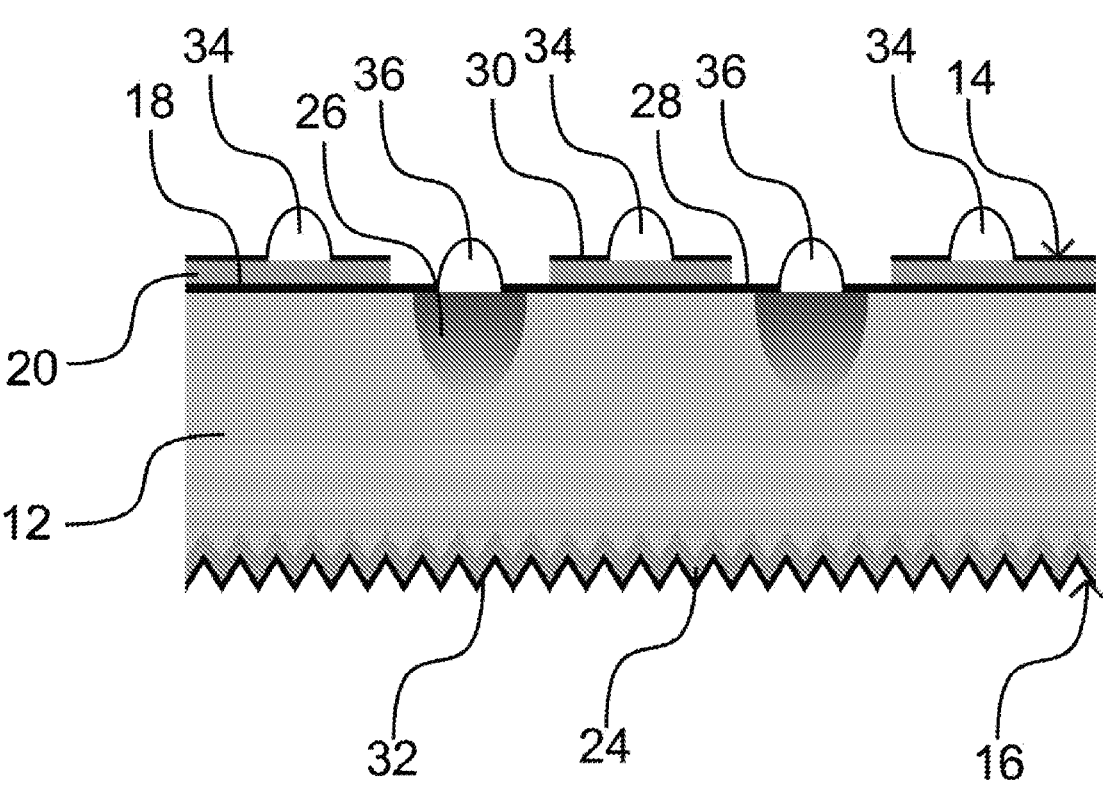
FIG. 1 is a schematic view of a section of a solar cell according to the invention.

FIG. 1 shows a section of a solar cell 10 having a semiconductor substrate 12, in particular a silicon wafer, a back side 14, and a front side 16 which faces the sun. The silicon wafer 12 can be doped either n-type or p-type. The solar cell 10 is explained by way of example using an n-type doping of the silicon wafer 12, the "base".

A polycrystalline highly doped p-type silicon layer 20 is provided on the back side 14. This forms a first polarity on the back side 14. In the region of the highly doped p-type silicon layer 20, a tunnel layer 18, in particular comprising silicon dioxide, 18 passivates the surface of the silicon wafer 12.

The solar cell 10 comprises, on the back side 14, electrodes 34 of a first polarity and electrodes 36 of a second polarity. Below the electrodes 34 of the first polarity is the tunnel layer 18 and the highly doped p-type silicon layer 20.

The electrodes 36 of the second polarity make direct electrical and mechanical contact with the semiconductor substrate 12. The electrodes 36 of the second polarity make contact with the semiconductor substrate 12 according to the illustrated embodiment in highly doped base regions 26. An uncontacted edge region 28 separates the highly doped p-type silicon layer 20 and the highly doped n-type base region 26.

The production process for the solar cell 10 is explained below with reference to FIGS. 2a to 2h. FIGS. 2a to 2h illustrate the process flow for the mask-free production of a solar cell 10 with a single type of selective contacts. As a starting material, the silicon wafer 12 having a front side 14 and a back side 16 can be doped either n-type or p-type. The process sequence is explained using an n-type doping of the wafer, the "base".

Figure 2A:
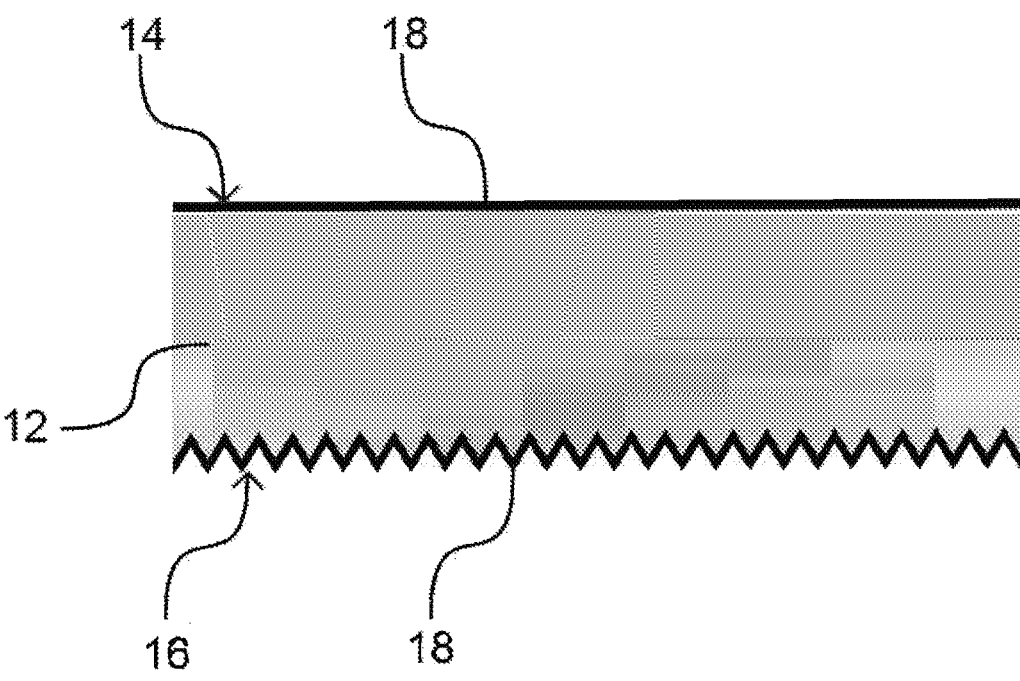
FIGS. 2a to 2h show a solar cell according to FIG. 1 in various steps of a method for producing the solar cell.

FIG. 2a shows the silicon wafer 12 with a polished back side 14 and a textured front side 16. A tunnel layer 18, for example a silicon dioxide, with a maximum thickness of preferably about four nanometers, is produced on both surfaces, or preferably only on the back side 14, for example in a thermal or wet-chemical process, or by deposition.

Figure 2B:
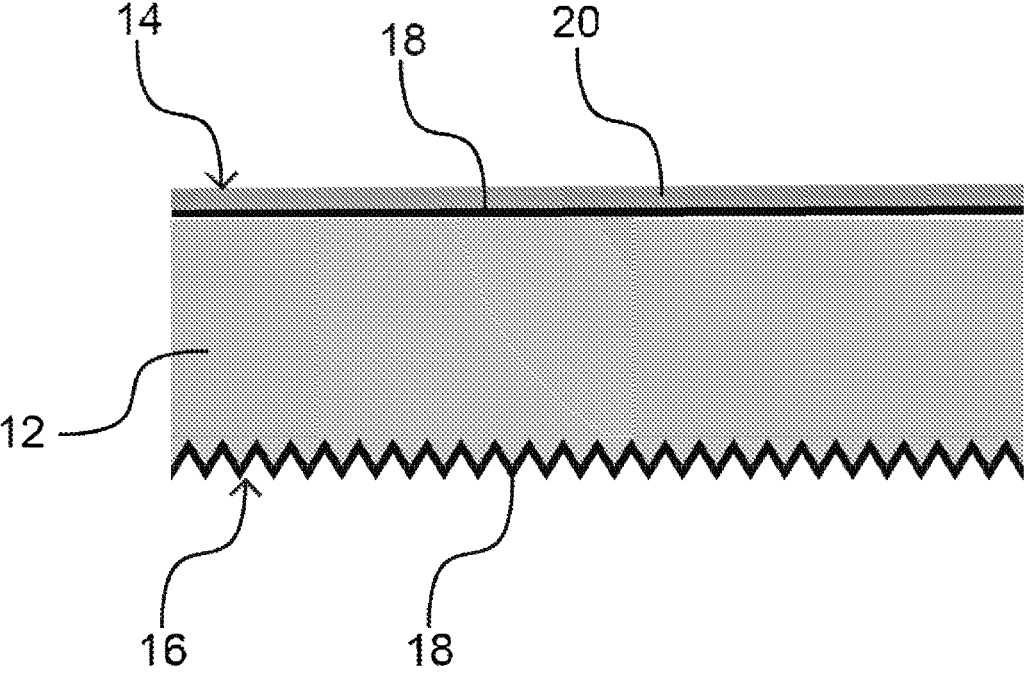

In a next step of the method, a highly doped silicon layer 20 of a first polarity is deposited on the tunnel layer 18 on the back side 14, in particular over the whole area thereof. In the following, a p-type doping is assumed to be the first polarity. FIG. 2b shows the full-area deposition of the highly doped p-type silicon layer 20 on the tunnel layer 18 on the back side 14. The highly doped p-type silicon layer 20 can be deposited, for example, by means of plasma-enhanced chemical vapor deposition, PECVD, atmospheric chemical vapor deposition, APCVD, low-pressure chemical vapor deposition (LPCVD), or sputtering. The highly doped p-type silicon layer 20 has a thickness of approximately 100 nanometers to 300 nanometers.

The highly doped p-type silicon layer 20 can also be deposited in two steps instead of in one step. In this case, depositing the p-type silicon layer 20 comprises depositing undoped silicon and then introducing a dopant. The dopant is introduced, for example, by means of ion implantation, furnace diffusion or laser diffusion. The dopant is, for example, boron, aluminum, or gallium.

Figure 2C:
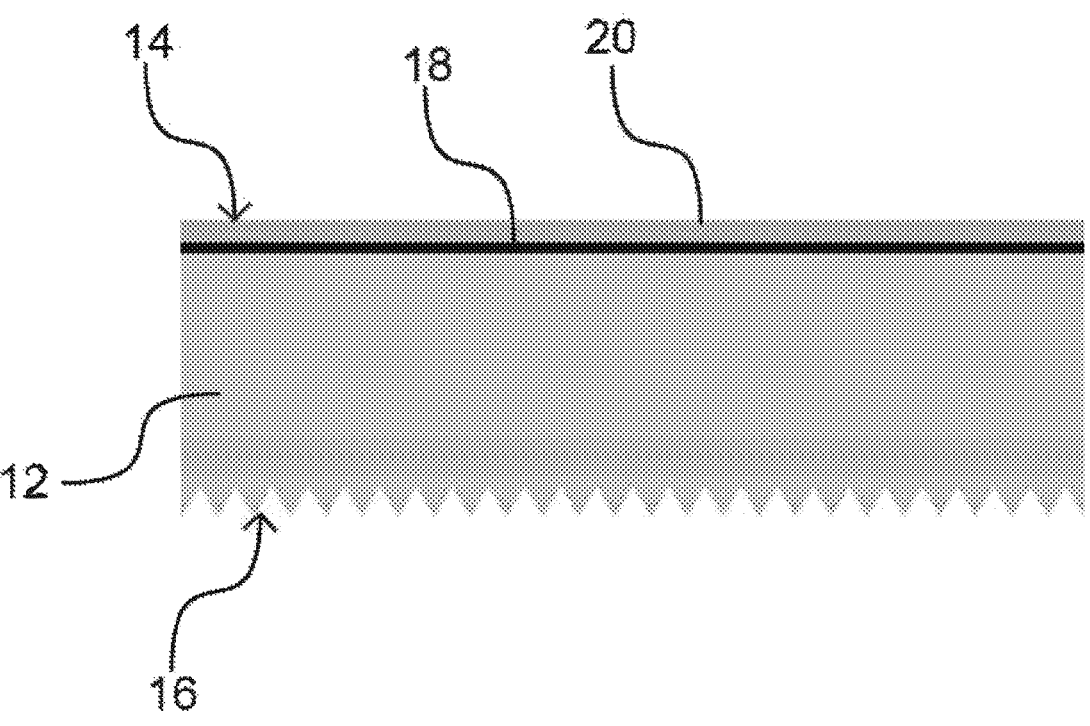

If there is a tunnel layer 18 and/or a highly doped p-type silicon layer 20, in particular an unintentionally deposited one, on the front side 16, the tunnel layer 18 and/or the highly doped p-type silicon layer 20 is removed from the front side 16 in a next step of the method. The tunnel layer 18 and/or the highly doped p-type silicon layer 20 can be etched away over the entire area or locally. This is shown in FIG. 2c.

Figure 2D:
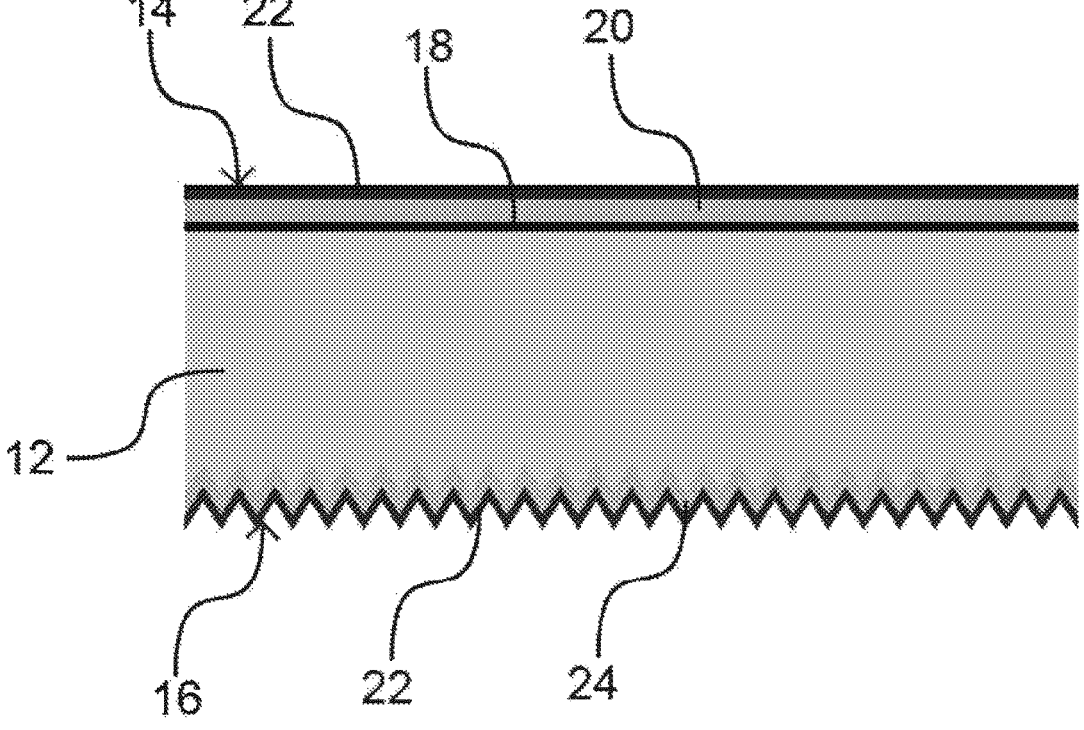

In a next step of the method, which is shown in FIG. 2d, a precursor layer 22 comprising a dopant, in particular phosphorus, is applied to the highly doped silicon layer 20 of the first polarity on the back side 14 and/or on the front side 16. According to the illustrated embodiment, the second polarity dopant is phosphorus. For example, a furnace diffusion process or a PECVD deposition is carried out to apply the precursor layer 22, in which process phosphorus silicate glass 22 grows on the highly doped p-type silicon layer 20 on the back side 14 and on the front side 16. During furnace diffusion, phosphorus from the phosphosilicate glass 22 diffuses into the front side 16 of the solar cell 10 and dopes the front side 16 surface to n-type. On the back side 14, the phosphorus also diffuses into the highly doped p-type silicon layer 20. The furnace diffusion process is advantageously carried out in such a way that a high proportion of phosphorus is contained in the phosphorus silicate glass 22 after the furnace diffusion process.

A concentration of the dopants in the highly doped p-type silicon layer 20 and the precursor layer 22 is advantageously selected such that, after the furnace diffusion, in the highly doped p-type silicon layer 20 the dopant concentration of the first dopant is higher than the dopant concentration of the second dopant, but in the precursor layer the amount of dopant of the second dopant is higher than the amount of dopant of the first dopant in the highly doped p-type silicon layer 20. This prevents overcompensation of the first dopant during furnace diffusion. The highly doped p-type silicon layer therefore remains p-type doped. In this way, however, sufficient dopant is present in the phosphorus silicate glass 22 for the following step of laser irradiation in order to overcompensate for the dopant of the first polarity during the laser irradiation.

Figure 2E:
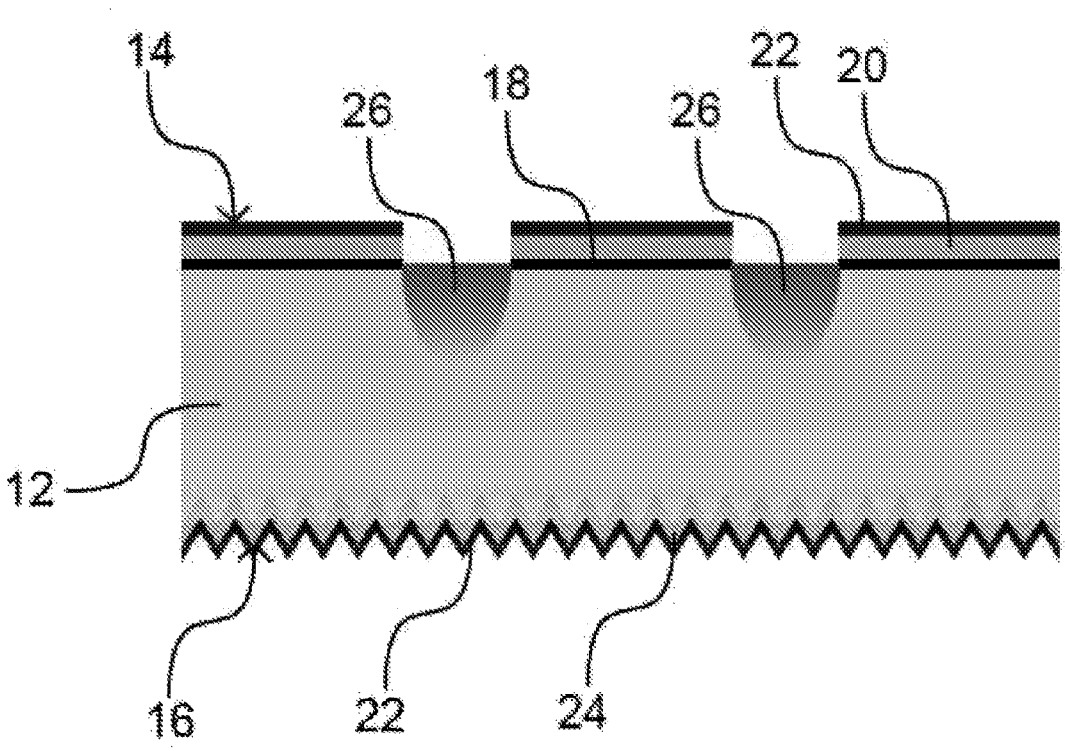

According to one embodiment, the method comprises a step of laser irradiation of the back side 14, in particular for producing locally highly doped n-type base regions 26. FIG. 2e shows the solar cell 10 after the back side 14 has been locally irradiated with a laser. The phosphorus silicate glass 22 serves as a doping source during the laser irradiation for the production of a locally highly doped n-type base surface in the locally highly doped n-type base regions 26. The energy of the laser radiation locally melts the phosphorus silicate glass 22, the highly doped p-type silicon layer 20, the tunnel layer, namely the silicon dioxide 18 and the surface of the back side 14, so that the locally highly doped n-type base regions 26 are created. The dopants from the phosphorus silicate glass 22 and the highly doped p-type silicon layer 20 diffuse into the silicon melt on the surface of the back side 14. After the laser radiation has subsided, the melt cools and solidifies. Both dopants remain in the silicon, with one or both dopants accumulating at the surface. Due to the greater amount of dopant of the second polarity dopant in the phosphorus silicate glass 22, the concentration of the second dopant in the solidified silicon surface is significantly higher than the concentration of the first dopant from the highly doped p-type silicon layer 20, and thus leads to a local high n-type doping due to overcompensation in locally highly doped n-type base regions 26. By a suitable choice of the laser parameters, portions of n-type silicon with locally-selectively different levels of doping can also be produced in the locally highly doped n-type base regions 26.

In the case of back-side contact solar cells with selective contacts of both polarities, high levels of recombination can occur if the two differently doped silicon layers come into contact. The method therefore includes a step of selectively removing the highly doped silicon layer 20 of the first polarity and/or the precursor layer 22.

Figure 2F:
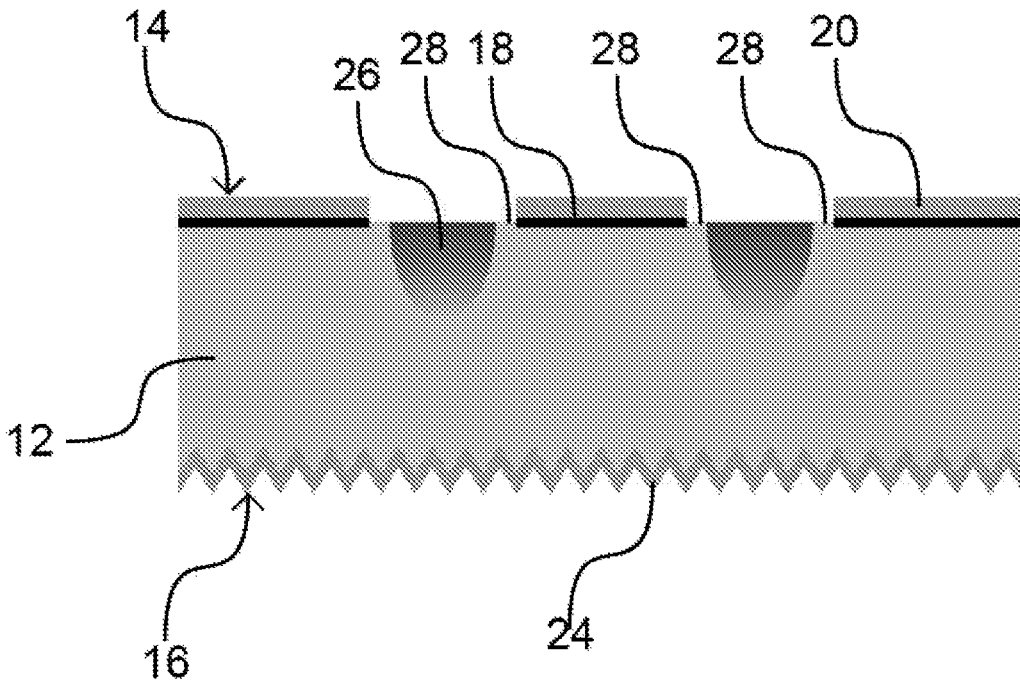

FIG. 2f shows the solar cell 10 after the highly doped p-type silicon layer 20 in the edge regions 28 of the locally highly doped n-type base regions 26 has been removed. The p-type silicon layer 20 in the edge regions 28 can be removed, for example, by laser irradiation, wet-chemical etching, or a combination of both processes. Furthermore, a wet chemical process can be used to remove the phosphosilicate glass 22 from the highly doped p-type silicon layer and the front side 16 of the solar cell. Etching back a few nanometers of the highly doped p-type silicon layer 20 can remove a silicon layer with a high phosphorus content, and limit an increase in layer resistance of the highly doped p-type silicon layer 20 by phosphorus diffusion.

Figure 2G:
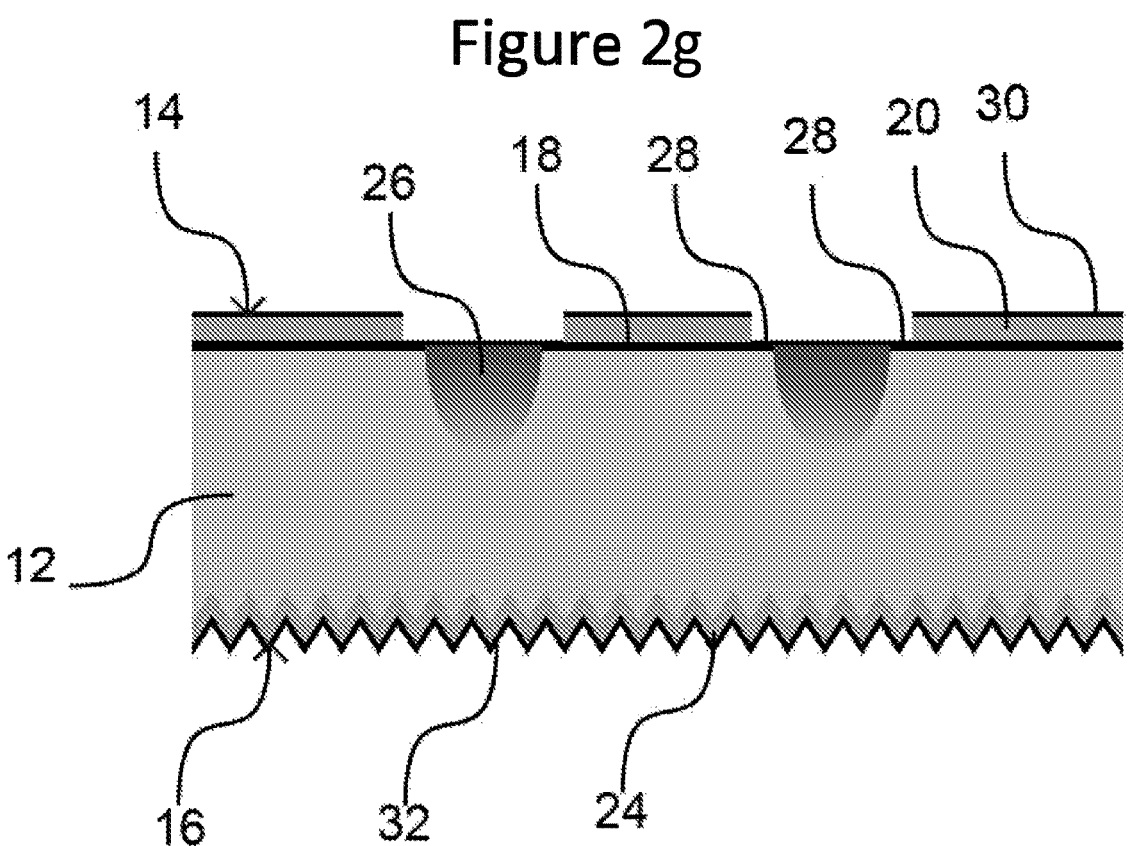

FIG. 2g shows the solar cell 10 after a passivation layer 30, 32 has been applied to the surface of the front side 16 and/or back side 14. The passivation layer 30, 32 comprises, for example, thermally grown silicon dioxide, silicon nitride, aluminum oxide, or a layer stack made up of two or more dielectric layers. The thickness, refractive index, and composition of the passivation layer 30 on the back side 14 can differ from the thickness, refractive index, and composition of the passivation layer 32 on the front side 16. The thicknesses, composition, and refractive indices of the passivation layers 30, 32 are advantageously optimized to reduce front side 16 reflection and increase back side 14 reflection.

Figure 2H:
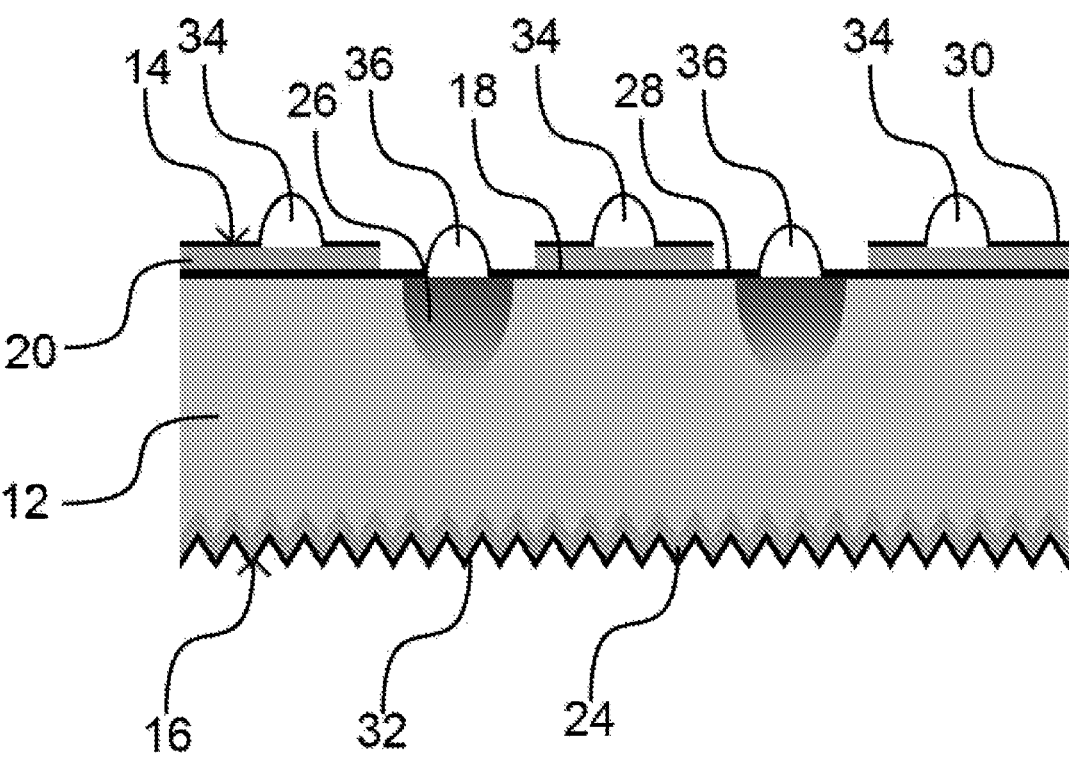

FIG. 2h shows the solar cell 10 after the electrodes 34, 36 have been applied to the back side 14 of the solar cell 10. The electrodes 34, 36 can be applied, for example, by means of screen printing, vapor deposition, sputtering, or galvanic deposition of one or more metals or other conductive layers. The electrodes 34, 36 can, for example, be silver paste, silver/aluminum paste, aluminum paste or pure aluminum, copper, tin, palladium, silver, titanium, nickel, or layer stacks or alloys of the metals mentioned, or other conductive layers, in particular conductive polymers or oxides, or a combination of such layers with metals. The composition and deposition process of the electrodes 34, 36 may differ for both polarities. The electrodes 34, 36 can penetrate the passivation layer locally, particularly in a high-temperature step after screen printing, and contact either the highly doped p-type silicon layer 20 or the locally highly doped n-type base regions 26, depending on the polarity of the electrodes.

Optionally, before the electrodes 34, 36 are applied, the passivation layer can be removed selectively, for example by laser irradiation, so that the electrodes make direct contact with the p-type silicon layer 20 or the locally highly doped n-type base regions 26.

What is claimed is:

1. A method for producing a back-side contact solar cell, wherein a semiconductor substrate of the solar cell comprises a polished or textured back side and a textured front side, wherein the method comprises the steps of:

applying a first tunnel layer comprising silicon dioxide to a surface of the back side, depositing a full-area, highly doped silicon layer of a first polarity on the first tunnel layer, the highly doped silicon layer of the first polarity comprising a first dopant, applying a first precursor layer of a second polarity comprising a second dopant on the highly doped silicon layer of the first polarity, wherein concentrations of the first and second dopants in the highly doped silicon layer and the first precursor layer are such that an amount of the second dopant in the first precursor layer is higher than an amount of the first dopant in the highly doped silicon layer, selectively laser irradiating regions of the first precursor layer and the highly doped silicon layer to locally produce highly doped base regions in the back side of the semiconductor substrate by overcompensation of the second dopant for the first dopant in the highly doped silicon layer, and selectively removing parts of the highly doped silicon layer and the first precursor layer to expose the surface of the back side, including the highly doped base regions and edge regions that (i) separate remaining parts of the highly doped silicon layer and the highly doped base regions and (ii) define a space along the surface of the back side between the highly doped silicon layer and the highly doped base regions.

2. The method according to claim 1, wherein depositing the highly doped silicon layer comprises depositing undoped silicon and subsequently introducing the first dopant into the undoped silicon.

3. The method according to claim 1, further comprising depositing a second tunnel layer on the front side, and removing the second tunnel layer from the front side.

4. The method according to claim 1, further comprising, after selectively removing the parts of the first highly doped silicon layer and the first precursor layer, applying a passivation layer to each of a front side of the semiconductor substrate and the back side of the semiconductor substrate.

5. The method according to claim 1, further comprising applying electrodes to the back side of the solar cell.

6. The method according to claim 4, further comprising selectively removing parts of the passivation layer on the back side of the semiconductor substrate and applying electrodes to the back side of the semiconductor substrate where the parts of the passivation layer have been selectively removed.

7. The method according to claim 1, further comprising applying a second precursor layer comprising the second dopant on the front side of the semiconductor substrate, and diffusing the second dopant into the front side of the semiconductor substrate.

8. The method according to claim 1, wherein the first precursor layer comprises a phosphosilicate glass.

9. The method according to claim 5, wherein the electrodes comprise (i) first electrodes on the highly doped silicon layer and (ii) second electrodes in direct electrical and mechanical contact with the highly doped base regions.

10. The method according to claim 6, wherein the electrodes comprise (i) first electrodes that make direct contact with the highly doped silicon layer and (ii) second electrodes in direct electrical and mechanical contact with the highly doped base regions.

11. The method according to claim 1, wherein the first precursor layer and the highly doped silicon layer are selectively laser irradiated at an energy that locally melts the first precursor layer, the highly doped silicon layer, the first tunnel layer, and the surface of the back side to create the highly doped base regions.

12. The method according to claim 11, wherein the semiconductor substrate comprises silicon.

13. The method according to claim 12, wherein selectively laser irradiating regions of the first precursor layer and the highly doped silicon layer forms melted silicon on the surface of the back side of the semiconductor substrate, and diffuses the first dopant and the second dopant into the melted silicon.

14. The method according to claim 13, further comprising cooling and solidifying the melted silicon after selectively laser irradiating regions of the first precursor layer and the highly doped silicon layer.

15. The method according to claim 14, wherein one or both of the first and second dopants accumulates at the surface of the back side of the semiconductor substrate.

16. The method according to claim 1, wherein the semiconductor substrate comprises silicon.

17. The method according to claim 1, wherein selectively removing parts of the highly doped silicon layer and the first precursor layer comprises laser irradiation, wet chemical etching, or a combination thereof.

18. The method according to claim 17, wherein selectively removing parts of the highly doped silicon layer and the first precursor layer comprises wet chemical etching, and etching the highly doped silicon layer limits an increase in layer resistance of the highly doped silicon layer.

* * * * *